United States Patent
Corrion et al.

(10) Patent No.: US 8,748,244 B1
(45) Date of Patent: Jun. 10, 2014

(54) ENHANCEMENT AND DEPLETION MODE GAN HMETS ON THE SAME SUBSTRATE

(75) Inventors: Andrea Corrion, Santa Monica, CA (US); Miroslav Micovic, Thousand Oaks, CA (US); Keisuke Shinohara, Thousand Oaks, CA (US); Peter J Willadsen, Thousand Oaks, CA (US); Shawn D Burnham, Oxnard, CA (US); Hooman Kazemi, Thousand Oaks, CA (US); Paul B Hashimoto, Los Angeles, CA (US)

(73) Assignee: HRL Laboratories, LLC, Malibu, CA (US)

(*) Notice: Subject to any disclaimer, the term of this patent is extended or adjusted under 35 U.S.C. 154(b) by 215 days.

(21) Appl. No.: 13/456,421

(22) Filed: Apr. 26, 2012

Related U.S. Application Data

(62) Division of application No. 12/686,855, filed on Jan. 13, 2010, now abandoned.

(51) Int. Cl.
*H01L 21/335* (2006.01)

(52) U.S. Cl.
USPC ........... 438/169; 438/167; 438/172; 257/268; 257/269; 257/E29.246; 257/E29.248; 257/E29.249; 257/E29.252; 257/E21.403; 257/274

(58) Field of Classification Search
None
See application file for complete search history.

(56) References Cited

U.S. PATENT DOCUMENTS

2006/0102932 A1* 5/2006 Hwang .................. 257/194
2007/0278519 A1* 12/2007 Baudet et al. .............. 257/192
2008/0169474 A1* 7/2008 Sheppard .................. 257/76

* cited by examiner

*Primary Examiner* — Fei Fei Yeung Lopez
(74) *Attorney, Agent, or Firm* — Daniel R. Allemeier; George R. Rapacki

(57) ABSTRACT

The present invention relates to fabrication of enhancement mode and depletion mode High Electron Mobility Field Effect Transistors on the same die separated by as little as 10 nm. The fabrication method uses selective decomposition and selective regrowth of the Barrier layer and the Cap layer to engineer the bandgap of a region on a die to form an enhancement mode region. In these regions zero or more devices may be fabricated.

6 Claims, 8 Drawing Sheets

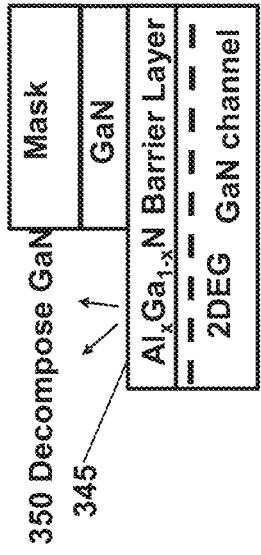
Fig 3a
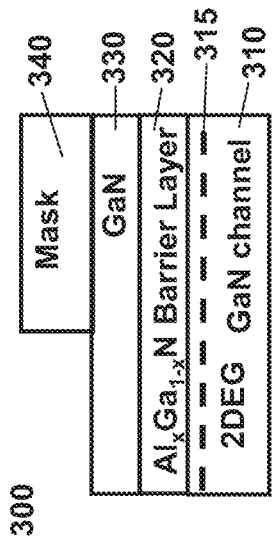
Fig 3b
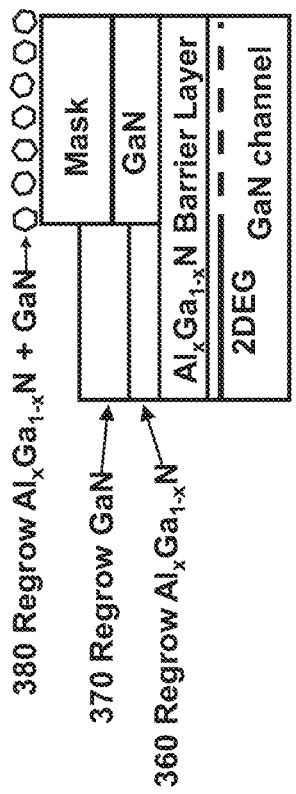
Fig 3c
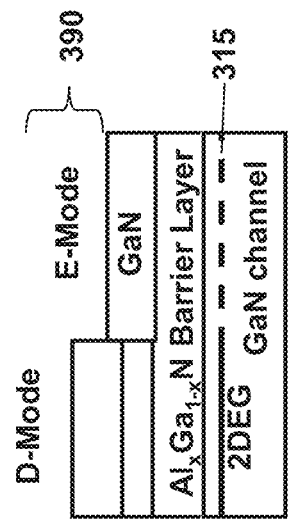
Fig 3d
Fig. 3

ENHANCEMENT AND DEPLETION MODE GAN HMETS ON THE SAME SUBSTRATE

RELATED APPLICATIONS

This application is a divisional of application Ser. No. 12/686,855 filed 13 Jan. 2010.

FIELD OF THE INVENTION

The present invention relates to the area of fabrication of enhancement and depletion mode Gallium Nitride High Electron Mobility Field Effect Transistors (HEMT), also known as heterostructure FETs (HFETs) or modulation-doped FETs (MODFETs). In particular, methods are presented to fabricate both enhancement and depletion mode devices on the same die.

BACKGROUND OF THE INVENTION

To date, the main effort of GaN electronics has been on depletion mode (D-mode) devices, while enhancement mode (E-mode) devices have been less extensively studied. However, E-mode devices are attractive for low-power digital applications, normally-off power switches, and high-efficiency RF applications. The integration of E- and D-mode devices on the same die would enhance the functionality of GaN components greatly. Several approaches to making E-mode devices on the same wafer as D-mode devices have been investigated, including Barrier layer ($Al_xGa_{1-x}N$) gate recesses, fluorine treatment, and buffer backbarriers [3-5]. Barrier layer ($Al_xGa_{1-x}N$) gate recesses and fluorine treatment have the flexibility of masking during processing, allowing integration of E- and D-mode devices on the same wafer [3, 6]. However, the dry plasma etching processes which are typically used for III-nitride processing can create damage in the material under the gate, and fluorine treatments suffer from poor controllability and reliability concerns. Selective buffer backbarriers (between the Substrate and the Channel layer) avoid problems associated with recess etching and fluorine treatment, but integration of E- and D-mode devices on the same wafer has not been shown.

SUMMARY OF THE INVENTION

This disclosure describes a method to fabricate enhancement-mode (E-mode) and depletion-mode (D-mode) Ga-polar ([0001]-oriented) HEMTs using selective $Al_xGa_{1-x}N$/GaN Barrier/Cap layer regrowth and polarization-assisted bandgap engineering on the same die to form regions where depletion mode devices may be fabricated and regions where enhancement mode devices may be fabricated. The approach described in this disclosure circumvents the prior art issues through masking and Barrier layer regrowth, which provides a controllable, etch-free process with the flexibility of E- and D-mode integration. It is known that strong polarization-induced electric fields along the <0001> axis of III-nitride materials produce band bending and the formation of a high-mobility, high-density, two-dimensional electron gas (2DEG) at the Barrier/Channel layer ($Al_xGa_{1-x}N$/GaN) interface [1-2]. The density of this 2DEG can be modified through polarization engineering of the band diagram by altering the Barrier layer ($Al_xGa_{1-x}N$) thickness, Barrier layer ($Al_xGa_{1-x}N$) composition x, Barrier height, and/or through introduction of Cap layers such as GaN of varying thickness. In this invention, the Barrier layer ($Al_xGa_{1-x}N$) is selectively modified through regrowth in order to manipulate the electric fields in the structure and hence the 2DEG density and threshold voltage, allowing the integration of E- and D-mode regions on a single die in a highly controllable process. Multiple enhancement mode and depletion mode regions may be fabricated on a single die and multiple dies may be fabricated on a single wafer.

In this invention, D-mode regions are fabricated on an E-mode die using thin $Al_xGa_{1-x}N$ Barrier layers and/or GaN Cap layers which raise the conduction band profile due to (spontaneous and piezoelectric) polarization effects and deplete the underlying 2DEG. The desired E-mode regions of the die are then masked, and regrowth of Barrier/Cap layer ($Al_xGa_{1-x}N$/GaN) is performed to create D-mode devices. Results indicate that the sheet resistivity and threshold voltage can be controlled through these regrowth processes, resulting in E- and D-mode regions on a single die.

In a first embodiment, a HEMT device comprising: a die wherein the die comprises an enhancement mode region and a depletion mode region; the enhancement mode region comprises a Channel layer, a first Cap layer of a first thickness, a first Barrier layer of a third thickness, and the first Barrier layer comprises $Al_xGa_{1-x}N$ with a composition X; the depletion mode region comprises the Channel layer, a second Cap layer of a second thickness, and a second Barrier layer of a fourth thickness, and the second Barrier layer comprises $Al_yGa_{1-y}N$ with a composition Y; wherein the third thickness is less than the fourth thickness; and wherein the enhancement mode region and the depletion mode region may be separated by approximately 10 nm.

In a second embodiment, the first embodiment wherein the first thickness is substantially equal to the second thickness.

In a third embodiment, the second embodiment wherein the enhancement mode region may be approximately 400 square nm in area.

In a fourth embodiment, the second embodiment wherein the enhancement mode region may be approximately 4800 square nm in area.

In a fifth embodiment, the first embodiment wherein the Channel layer comprises GaN, the first Cap layer and the second Cap layer comprise GaN. Furthermore, the Channel layer may be 20 to 40 nm thick, x=1, the first thickness may be substantially 2.5 nm, the third thickness may be substantially 2.0 nm and the fourth thickness may be substantially 3.5 nm.

In another embodiment, the first embodiment wherein the first thickness may be substantially 1.0 nm, the second thickness may be substantially 50 nm, the third thickness may be substantially 1.2 nm with the composition X substantially equal to 0.2, a fourth thickness substantially equal to 20 nm and the composition Y substantially equal to 0.8.

In another embodiment, the first embodiment wherein the first thickness, the third thickness and a composition of the first Barrier layer provide a threshold voltage greater than zero, and wherein the second thickness, the fourth thickness and a composition of the second Barrier layer provide a threshold voltage less than zero.

In another embodiment, the first embodiment wherein the Channel layer comprises GaN, the first and second Cap layers comprise GaN.

In another embodiment, the first embodiment wherein the Channel layer is 20-40 nm thick.

In another embodiment, a method of converting an enhancement mode region on a die to a depletion mode region comprising: receiving the die substantially comprising an enhancement mode region wherein the enhancement mode region comprises a Channel layer, Barrier layer and Cap layer; masking the region to be preserved as an enhancement mode region; decomposing the Cap layer to expose the Barrier layer; regrowing the Barrier and Cap layer such that a depletion mode region is created; removing the mask from the device. The Channel layer and Cap layer may comprise GaN, and the Barrier layer may comprise $Al_xGa_{1-x}N$, $0<x\leq 1$.

BRIEF DESCRIPTION OF THE DRAWINGS

The accompanying drawings, together with the specification, illustrate exemplary embodiments of the present invention, and together with the description, serve to explain the principles of the present invention.

FIG. 3a-d: Schematic of the fabrication of a D-mode region on a die comprising substantially a E-mode region.

Figure 1:
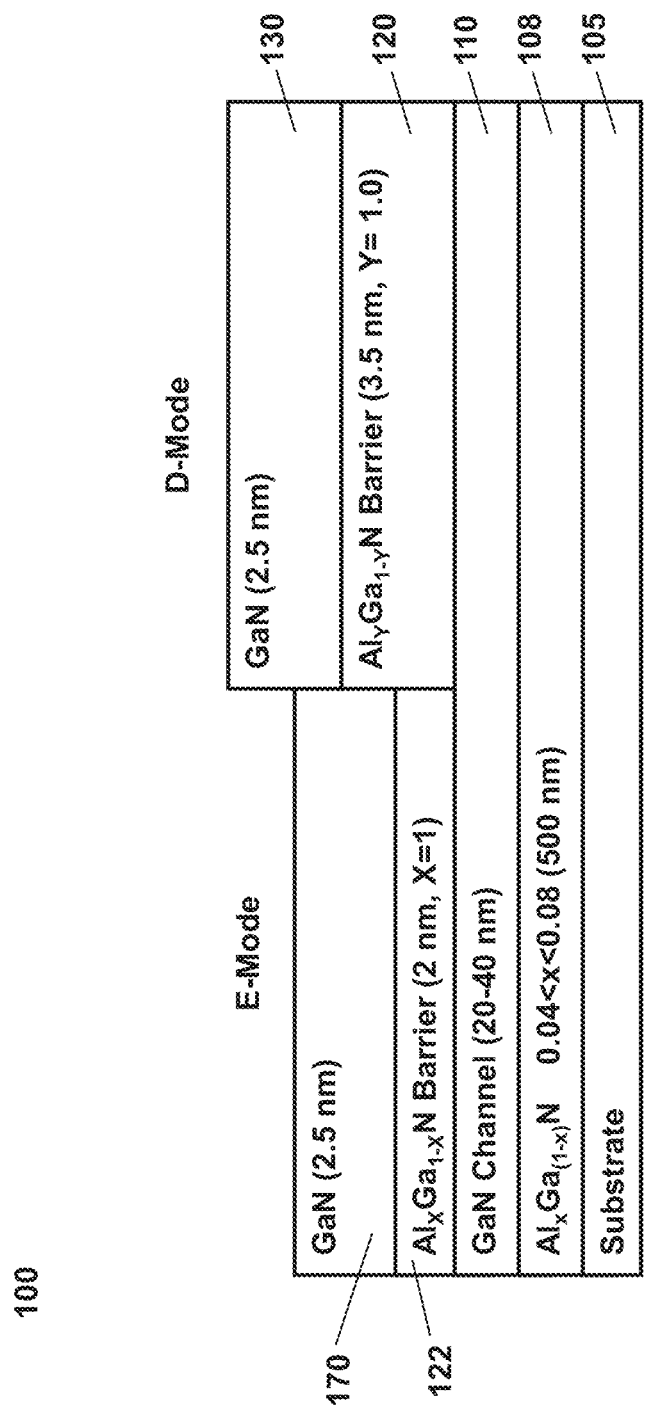
FIG. 1: Structure of depletion mode (D-mode) and enhancement mode (E-mode) FETs showing schematically the different thicknesses and compositions achievable with Cap and Barrier layer regrowth. Final source, drain and gate structures, insulating coatings, passivation coatings and field plates omitted.

The following papers are incorporated by reference as though fully set forth herein:

[1] O. Ambacher, J. Smart, J. R. Shealy, N. G. Weimann, K. Chu, M. Murphy, W. J. Schaff, and L. F. Eastman, "Two-dimensional electron gases induced by spontaneous and piezoelectric polarization charges in N- and Ga-face AlGaN-GaN heterostructures", J. Appl. Phys. 85 3222 (1999).
[2] I. P. Smorchkova, C. R. Elsass, J. P. Ibbetson, R. Vetury, B. Heying, P. Fini, E. Haus, S. P. DenBaars, J. S. Speck, and U. K. Mishra, "Polarization-induced charge and electron mobility in AlGaN/GaN heterostructures grown by plasma-assisted molecular beam epitaxy", J. Appl. Phys. 86 4520 (1999).
[3] Y. Cai, Z. Cheng, W. C. W. Tang, K. M. Lau, and K. J. Chen, "Monolithically Integrated Enhancement/Depletion-Mode AlGaN/GaN HEMT Inverters and Ring Oscillators using CF4 Plasma Treatment", IEEE Trans. Elec. Dev. 53 2223 (2006).
[4] W. B. Lanford, T. Tanaka, Otoki, and I. Adesida, "Recessed-gate enhancement-mode GaN HEMT with high threshold voltage", Electronics Lett., 41 (2005).
[5] R. Chu, Z. Chen, S. P. DenBaars, U. K. Mishra, "V-gate GaN HEMTs with Engineered Buffer for Normally-off Operation", IEEE Elec. Dev. Lett., 29 1184 (2008).
[6] M. Micovic, T. Tsen, M. Hu, P. Hashimoto, P. J. Willadsen, I. Milosavljevic, A. Schmitz, M. Antcliffe, D. Zhender, J. S. Moon, W. S. Wong, and D. Chow, "GaN enhancement/depletion mode FET logic for mixed signal applications", Elec. Lett., 41 (2005).
[7] M. Higashiwaki, T. Mimura, and T. Matsui, "Enhancement-mode AlN/GaN HFETs using Cat-CVD SiN'", IEEE Trans. Elec Dev. 54 1566 (2007).
[8] S. Fernandez-Garrido, G. Koblmuller, E. Calleja, and J. S. Speck, "In-situ decomposition analysis by quadrupole mass spectrometry and reflection high-energy electron diffraction", J. Appl. Phys. 104 033541 (2008).
[9] S. R. Lee, D. D. Koleske, K. C. Cross, J. A. Floro, K. E. Waldrip, A. T. Wise, and S. Mahajan, "In situ measurements ents of the critical thickness for strain relaxation in AlGaN/GaN heterostructures" Appl. Phys. Lett. 85 6164 (2004).

DETAILED DESCRIPTION

Although embodiments of the present invention are applicable to many different devices, they are particularly applicable to microwave and millimeter power GaN transistors and high-voltage switching GaN transistors.

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

It is also understood that when an element such as a layer, region or substrate is referred to as being "on" another element, it can be directly on the other element or intervening elements may also be present. Furthermore, relative terms such as. "inner", "outer", "upper", "above", "lower", "beneath", "below", and similar terms., may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and or sections, these elements, components, regions, layers and or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. It is understood that many of the layers will have different relative thicknesses compared to those shown. Further, variations from the shapes of the illustrations as a result, for example, of manufacturing techniques and or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIGS. 1, and 3 show two embodiments of the present invention to fabricate E-mode and D-mode regions on the same wafer or die. Some embodiments of the invention may be particularly well-suited for use in nitride-based devices such as Group III-nitride based HEMTs. As used herein, the term "Group III-nitride" refers to those semiconducting compounds formed between Nitrogen and the elements in Group III of the periodic table, usually Aluminum (Al), Gallium (Ga), and or Indium (In). The term also refers to ternary and quaternary compounds, such as AlGaN, InGaN, and AlInGaN. As well understood by those in this art, the Group III elements can combine with Nitrogen to form binary (e.g., GaN), ternary (e.g., AlGaN and AlInN), and quaternary (e.g., AlInGaN) compounds. Although many material systems may be used, in a preferred embodiment, zero or more gallium nitride high electron mobility transistor (GaN HEMT) devices are fabricated in each E-mode and D-mode region of a die.

Single or multiple layers of the above materials of varying composition may be used to fabricate E-mode and D-mode devices as long as the bandgap of the Channel layer is less than the band gap of the Barrier layer. With this criteria and the fact that InN has bandgap of 0.7 eV, GaN has a bandgap of 3.4 eV and AlN has a bandgap of 6.2 eV, one can envision many variations of materials for E-mode and D-mode devices. For example and not by way of limitation, a Barrier layer of AlN means the Channel layer may be GaN or InN or a combination thereof.

One of the performance indexes for GaN HEFTs (or HEMTs) is a threshold voltage (hereinafter, referred to as $V_{th}$). Based on the $V_{th}$ value being positive or negative, an operational mode of the HFET is classified as a normally-off (enhancement) mode or a normally-on (depletion) mode. Hence an HFET with a positive threshold voltage is an Enhancement mode (E-mode) device and an HEFT with a negative threshold voltage is a Depletion mode (D-mode) device. In the normally-on mode, even when the voltage applied to the gate electrode is 0 V, a current may flow through the source and drain electrodes In effect, the source and drain electrodes are short-circuited even during a power failure, and as a result, it is not suitable for use as a switch for a power source system. Conventionally, the general HFET operates in the normally-on mode, and thus it is preferably modified to operate in the normally-off mode. One of the methods of modifying the HFET to operate in the normally-off (enhancement) mode is to reduce the thickness of the group III nitride semiconductor Barrier layer.

In this invention the charge density of the 2DEG is engineered by building layers of particular materials on the sub-nanometer scale through regrowth. Regrowth means using Molecular Beam Epitaxy (MBE) or Metal Organic Chemical Vapor Deposition (MOCVD) to build up a material while preserving the crystal structure of the substrate. If MBE is used for regrowth, very fine control of the deposition process is possible because the rate of material accumulation is less than the time needed to throttle the material deposition, for example by positioning a shutter between the material source and the target.

FIG. 1 shows the device 100 according to the present invention. The device 100 comprises a Substrate 105, an optional Buffer or back Barrier layer 108 and a Channel layer 110. The E-mode region comprises an added Barrier layer 122 of a third thickness and composition X, and a Cap layer 170 of a first thickness. The D-mode region comprises an added Barrier layer 120 of a fourth thickness and composition X and a Cap layer 130 of a second thickness. The dimensions shown in FIG. 1 define one embodiment of the present invention, consistent with the limitations in FIG. 6. The Substrate 105 in FIG. 1 may be an entire wafer or a die of a final device. The Substrate 105 may comprise SiC, sapphire, Si or GaN. The optional Buffer layer 108 may comprise approximately 500 nm of $Al_xGa_{1-x}N$ with $0.04<X<0.08$. The person skilled in the art will realize other formulations of the Substrate 105 and Buffer layer 108 are possible and the formulation shown is by way of example and not limitation. In particular, the Barrier layers 120 and 122 may each be comprised of several layers.

In the first fabrication process 300 in FIG. 3, a GaN Channel layer 310 is deposited on the wafer (not shown in FIG. 3). The wafer may comprise a substrate with a suitable buffer layer which may be $Al_xGa_{1-x}N$, $x=0.04$. Next, E-mode device regions are grown using thin $Al_xGa_{1-x}N$ Barrier layers 320, $0<x\leq1$. In some embodiments, the E-mode device region is completed by adding the appropriate thickness of a GaN Cap layer 330. The GaN Cap layer 330, if used, may raise the conduction band profile due to polarization effects (spontaneous and piezoelectric) and as in FIG. 3a. The desired E-mode regions are then masked 340 to preserve the desired E-mode regions of the die or wafer. In one embodiment, SiO2 may be used, but alternate masks such as SiN or Al2O3 may be used as well. The resulting structure induces a two dimensional electron gas (2DEG) 315 through a difference in spontaneous polarizations and a difference of piezo polarizations, whose charge density and band gap location is controlled by the thicknesses, mole fraction and doping of the Channel layer, 310, Barrier layer 320 and Cap layer 330. The result is a depletion of the charge in the underlying 2DEG 315.

FIG. 3b shows the next steps in the fabrication process of D-mode and E-mode regions on the same die. Before regrowth, the GaN Cap 330 in the unmasked region is thermally decomposed 350 at high temperatures in the growth chamber which exposes the $Al_xGa_{1-x}N$ Barrier Layer 320, $0<x\leq1$. The decomposition is performed in situ in the MBE or MOCVD chamber such that the decomposed surface 345 is not exposed to contaminants or air before regrowth. Thermal decomposition of GaN occurs in a layer-by-layer congruent decomposition mode, so that substantially no excess gallium metal is left on the surface 345 [8]. Desorption of disassociated Ga and N atoms is blocked in the masked regions of the device, preventing decomposition in those regions. Due to the lower binding energy of GaN relative to AlN, the thermal decomposition rate of $Al_xGa_{1-x}N$ is less relative to GaN, so that decomposition selectively stops at the Barrier layer. The process of GaN decomposition also removes impurities on the wafer surface, cleaning the surface for regrowth. Decomposition may be accomplished by heating the device in a vacuum to approximately 750 to 850 degrees C. with approximately 800 degrees C. preferred. The vacuum pressure is approximately 10E-4 Torr or less. The decomposition time depends on the thickness of the GaN layer. The decomposition rate of GaN at 750 degrees C. is ~0.85 nm/min, and at 850 degrees C. it is ~19.6 nm/min, resulting in approximate times of 2.3 min and 6 sec, respectively, for a GaN Cap 330 of thickness 2 nm. Decomposition is described in "In situ GaN Decomposition Analysis by Quadrupole Mass Spectrometry and Reflection High-Energy Electron Diffraction" by Fernández-Garrido et. al. Journal of Applied Physics, 104, August 2008 which is hereby incorporated by reference in its entirety.

Regrowth of the (Barrier layer/Cap layer) $Al_xGa_{1-x}N$ 360/GaN 370 is performed for D-mode device regions in the next step shown in FIG. 3c. Increasing the Barrier layer thickness increases the charge density in the 2DEG below the Barrier layer such that a D-mode device region and E-mode device region are adjacent. In this way, the Barrier layer and Cap thicknesses in both the E- and D-mode regions can be tailored for the desired threshold voltage through polarization-assisted band engineering. The Barrier layer, if comprised of $Al_xGa_{1-x}N$, $0<x\le1$, is regrown through Metal Organic Chemical Vapor deposition (MOCVD), Molecular Beam Epitaxy (MBE) or other methods known in the art. If MBE is used to regrow the Barrier Layer or Cap layer then regrowth may be in increments of a single monolayer of the regrowth material. For GaN materials the regrowth layer increment may be as little as 0.26 nm thick. In one embodiment the regrown layer has a thickness greater than 0.26 nm. Optionally, the regrown Barrier layer 360 may have a different composition X than the Barrier layer 320.

Figure 2:
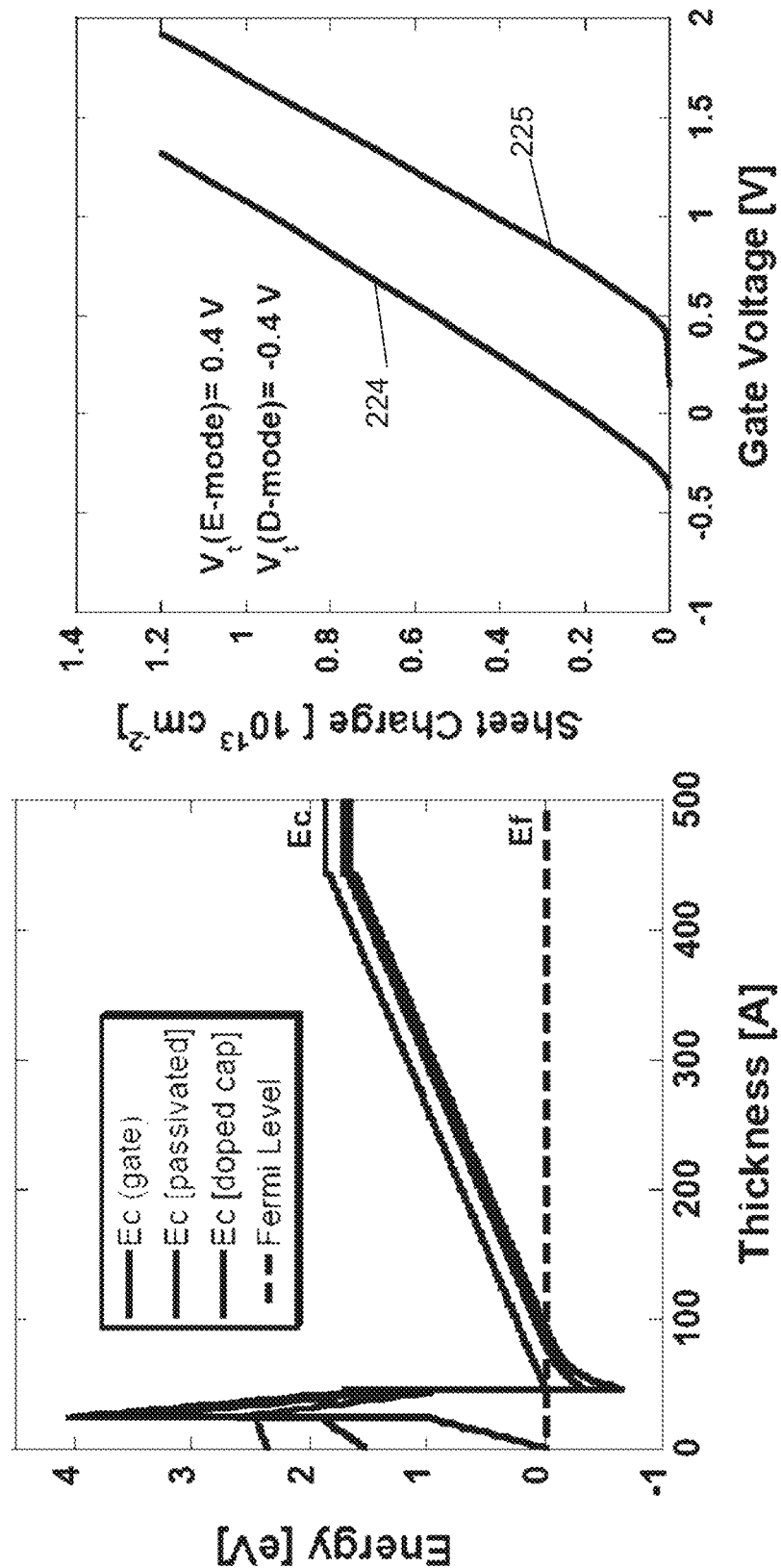
FIG. 2a Calculated conduction band energy diagrams for (Barrier Layer/Cap Layer $Al_xGa_{1-x}N/GaN$, x=1) HEMTs with varying surface terminations. The energy band diagram in FIG. 2a corresponds to the E-mode structure in Table 1.
FIG. 2b calculated sheet charge dependence on gate voltage for HEMTs, (Barrier/Cap Layer $Al_xGa_{1-x}N/GaN$, x=1), with varying Barrier layer thickness.

The regrowth of the Barrier layer and/or Cap layer ($Al_xGa_{1-x}N$ 360/GaN 370) leaves sonic material 380 on the mask 340. As shown in FIG. 3d, this excess regrown material 380 and mask 340 are removed by standard, known processes. For example, by using a selective wet or dry etch process. Alternatively, HF acid could be used to remove a SiO2 mask 340 without damaging the regrown $Al_xGa_{1-x}N$/GaN in the depletion-mode regions. The result at this stage is one or more D-mode islands in an E-mode region. This is indicated in FIG. 3d as the line 315. The dashed portion indicates enhancement mode operation while the solid line portion indicates depletion mode operation. These D-mode islands may be as small as 400 square nm each and need E-Mode structure with an $Al_{0.04}Ga_{0.96}N$ buffer layer between the Substrate and the Channel layer, a GaN Channel layer, an AlN Barrier layer and a GaN Cap and varying surface terminations (gate metal, passivated, and n+ doped GaN cap) are shown in FIG. 2a. The band diagrams in FIG. 2a were calculated using a Poisson-Schroedinger equation solver with the material parameters from [1] and the estimated Barrier heights in Table 1. The calculation accounted for polarization effects, which lead to band bending in the Barrier layer and induce the formation of a 2DEG at the Barrier/Channel layer interface. The density of the 2DEG can be modified by the Barrier height (shown). In addition, due to the strong spontaneous and piezoelectric polarization-induced electric field in the $AlGa_{1-x}N$ Barrier layer, where x=1, the 2DEG density increases with increasing $Al_xGa_{1-x}N$ Barrier layer thickness, where x=1. FIG. 2b shows the corresponding calculated sheet charge dependence on gate voltage for two different $Al_xGa_{1-x}N$, x=1, Barrier layer thicknesses. The calculation predicts E-mode operation 225 with Vth=+0.4 V for a device with 2 nm thick AlN Barrier layer and D-mode operation 224 with Vth=−0.4 V for the device with 2.6 nm thick AlN Barrier layer. These embodiments demonstrate example configurations, without implying a limitation, for E-mode and D-mode devices produced by varying the 2DEG density and threshold voltage in $Al_xGa_{1-x}N$/GaN HEMTs with the $Al_xGa_{1-x}N$ Barrier layer thickness and Cap layer thickness.

The devices in table 1 used a 500 nm $Al_xGa_{1-x}N$ buffer layer, $0.04\le X\le0.08$, between the Substrate and the GaN Channel. The Channel was 20 to 40 nm thick.

TABLE 1

Epi structure and data summary of E- and D-mode regions grown with varying Barrier layer thicknesses.

| EPI type | Barrier Layer Thickness, x = 1 nm | GaN Cap Layer Thickness nm | Sheet Rho As Grown Ω/Sq | Sheet Rho Passivated Ω/Sq | 2 DEG Charge Passv $10^{13}/cm^2$ | 2 DEG Mobility Passv $cm^2/Vs$ | Estimated Surface Barrier Height | | Gate Metal |
|---|---|---|---|---|---|---|---|---|---|
| | | | | | | | Un-Passv | Passv | |
| E-Mode | 2 | 2.5 | >105 | 720 | 0.6 | 1446 | 3.2 eV | 1.54 eV | 2.7 eV |
| D-Mode | 2.6 | 2.5 | 4000 | 450 | 0.98 | 1417 | 3.2 eV | 1.66 eV | 2.7 eV | approximately 10 to 20 nm separation from the E-mode region. The E-mode region may be the remainder of the area of a die.

The remaining steps for forming E-mode and D-mode devices in the appropriate regions prior to separating the individual dies from the wafer, described herein for completeness and not by way of limitation, include forming gate, source and drain contacts, adding insulation and passivation coatings, and forming field plates as necessary. Methods for each of these steps are known to those skilled in the art.

The embodiment described in FIG. 3 exploit (piezoelectric and spontaneous) polarization effects to engineer the 2DEG density to produce a D-mode region from an E-mode region (FIG. 3). When GaN is grown on $Al_xGa_{1-x}N$ in the Ga-polar (0001) orientation, a fixed negative sheet charge forms at the GaN/AlGaN interface due to the discontinuity in polarization (spontaneous and piezoelectric) between the materials which gives rise to an electric field that raises the conduction band. This can be seen in the calculated energy diagrams shown in FIG. 2a.

The embodiment described in FIG. 3 may be further limited to regrowth in the gate region.

Figures 4A, 4B:
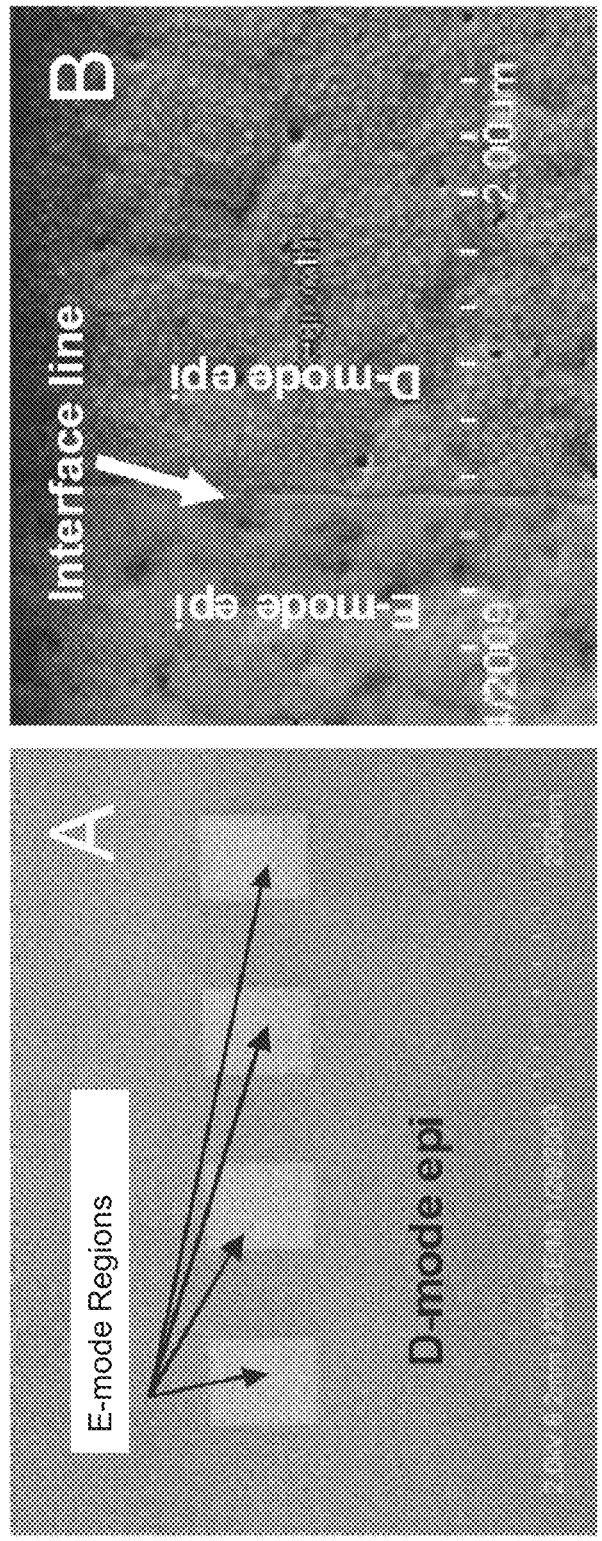
FIG. 4: Scanning Electron Micrograph images showing 4a E-mode regions surrounded by D-mode epitaxially-regrown regions, and 4b the E- and D-mode epitaxial layer interface.

For the example embodiments shown in table 1, conduction band diagrams for the 2 nm $Al_xGa_{1-x}N$ x=1 Barrier layer, FIG. 4a shows scanning electron microscopy images of the experimental regrowth regions after regrowth. The images show one embodiment where the interface between the E-mode and D-mode layers is on the order of 10-20 nm (FIG. 4b). The E-mode regions in FIG. 4a are approximately 60 nanometers by 80 nanometers or an area of 4800 square nm. The E-mode and D-mode regions are separated by a boundary greater than approximately 10 to 20 nm.

Figure 5:
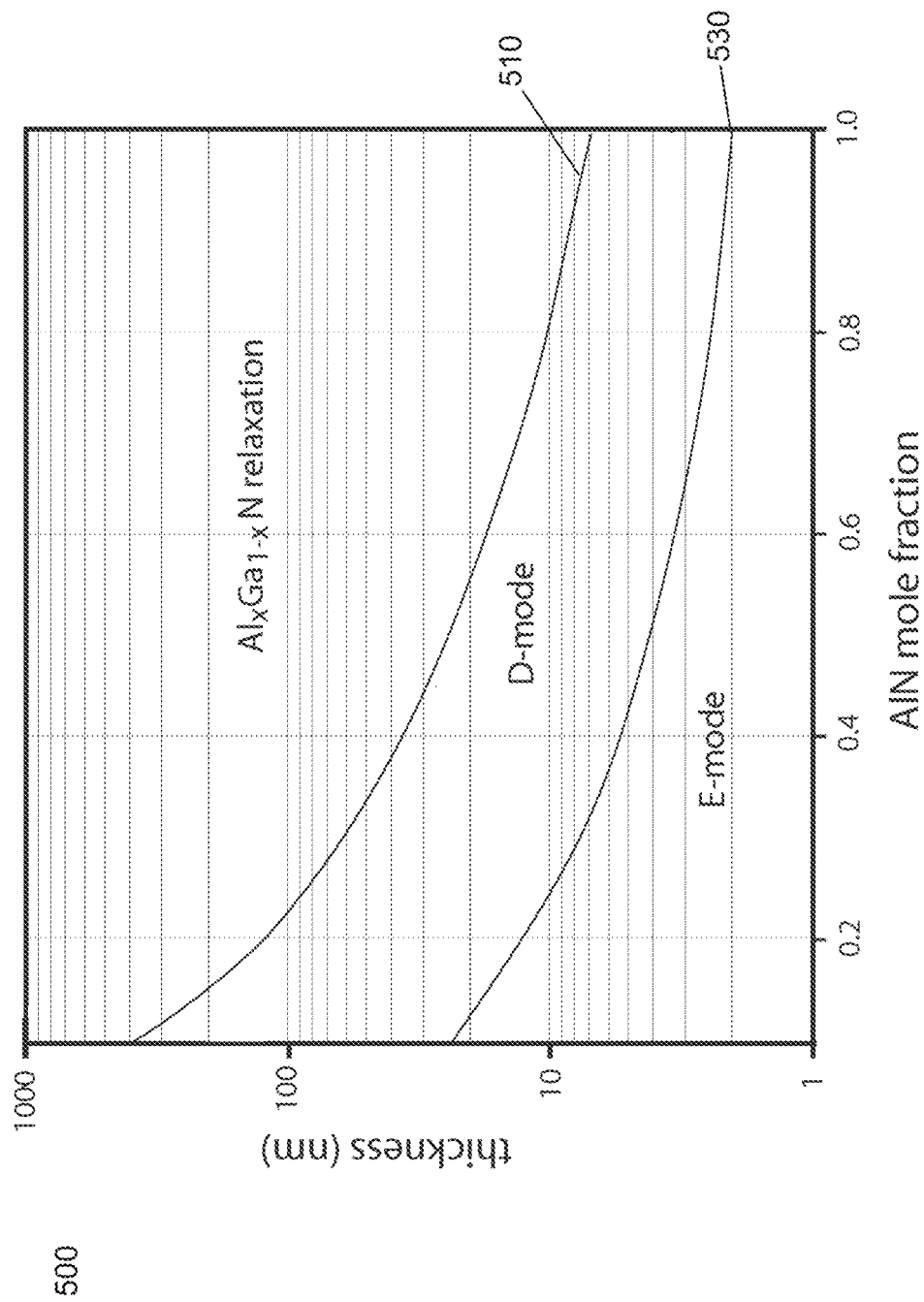
FIG. 5: Calculated boundary between E- and D-mode HEMT operation (lower curve), as well as the onset of relaxation of strained AlGaN on GaN based on the Griffith criterion for Channel crack formation (upper curve) for varying $Al_xGa_{1-x}N$ compositions and thicknesses. The onset of AlGaN relaxation was calculated as in reference 9 and provides a practical upper thickness limit of the AlGaN Barrier layer in AlGaN/GaN HEMTs.

FIG. 5 shows the dimensions and composition for the Barrier layer for D-mode and E-mode devices. FIG. 5 shows the boundary 530 between E-mode and D-mode devices as a function of the AlGaN Barrier layer thickness and the AlGaN Barrier layer composition. The boundary 530 is based on a 2.5 nm Cap layer. The location of the curve 530 depends on the thickness of the Cap layer. As the Cap layer thickness increases the curve defining the boundary between D-mode and E-mode regions moves up.

FIG. 5 shows the boundary 510 for relaxation of strained AlGaN on fully-relaxed GaN based on the Griffith criterion for Channel crack formation (taken from reference 9), which agrees well with experimental observations [9]. The boundary 510 provides a practical limit to AlGaN thickness since strain relaxation greatly degrades device performance. The boundary 530 between E-mode and D-mode operation was computed based on band structure calculations of devices with an undoped GaN buffer layer between the Substrate and Channel layer, variable thickness and composition $Al_xGa_{1-x}N$ Barrier layer, and undoped 2.5 nm thick GaN Cap layer [10], with the criterion of $n_{2DEG} < 1 \times 10^{11}$ cm$^{-2}$ for E-mode operation (the AlGaN was assumed to be fully strained in these calculations). This formulation applies to all compositions of $Al_xGa_{1-x}N$ at thicknesses below the limit of relaxation via crack formation shown in FIG. 5.

Figure 6:
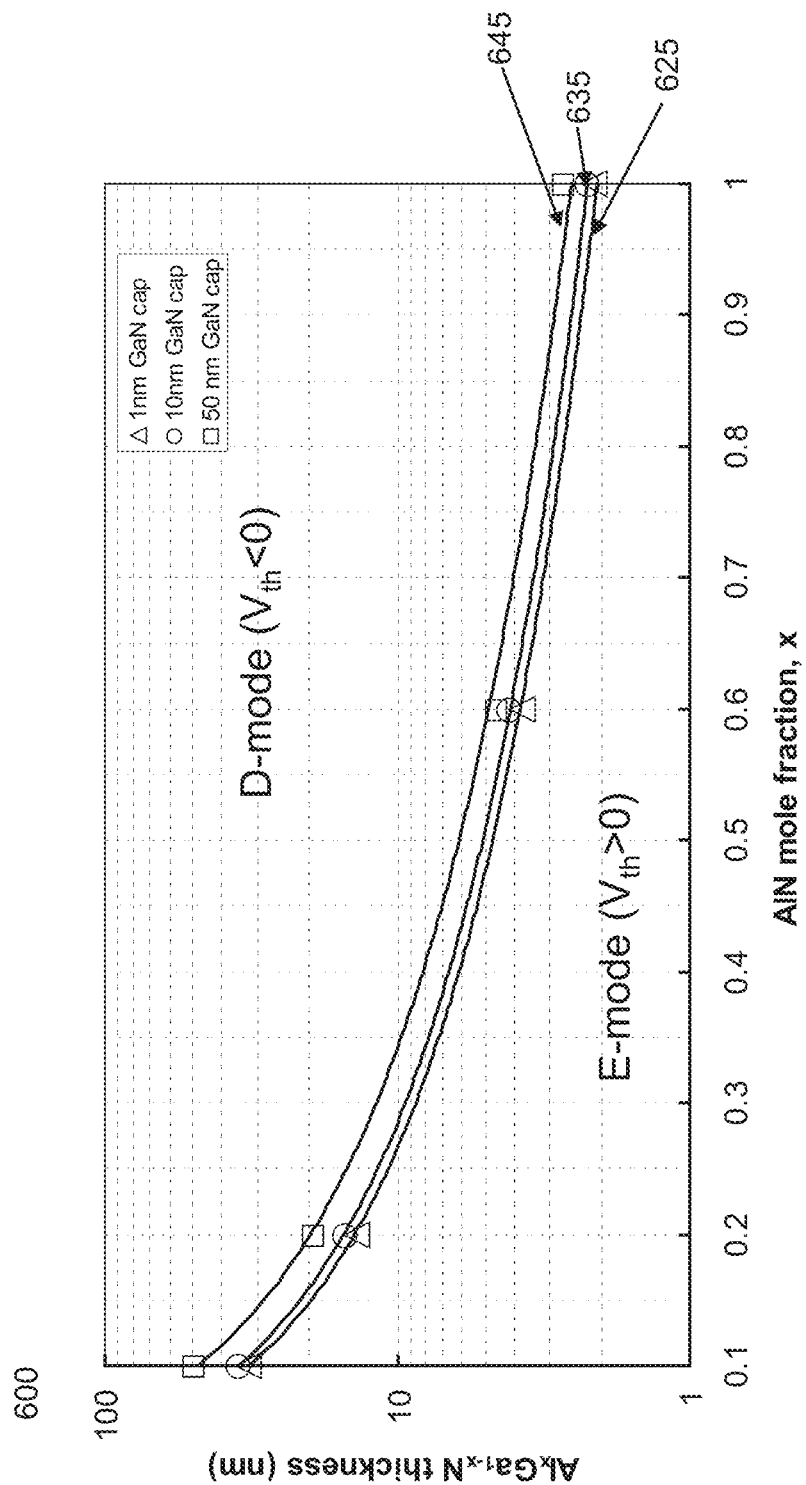
FIG. 6 Calculated boundary between E and D Mode HEMT operation for three Cap layer thicknesses.
Figure 7:
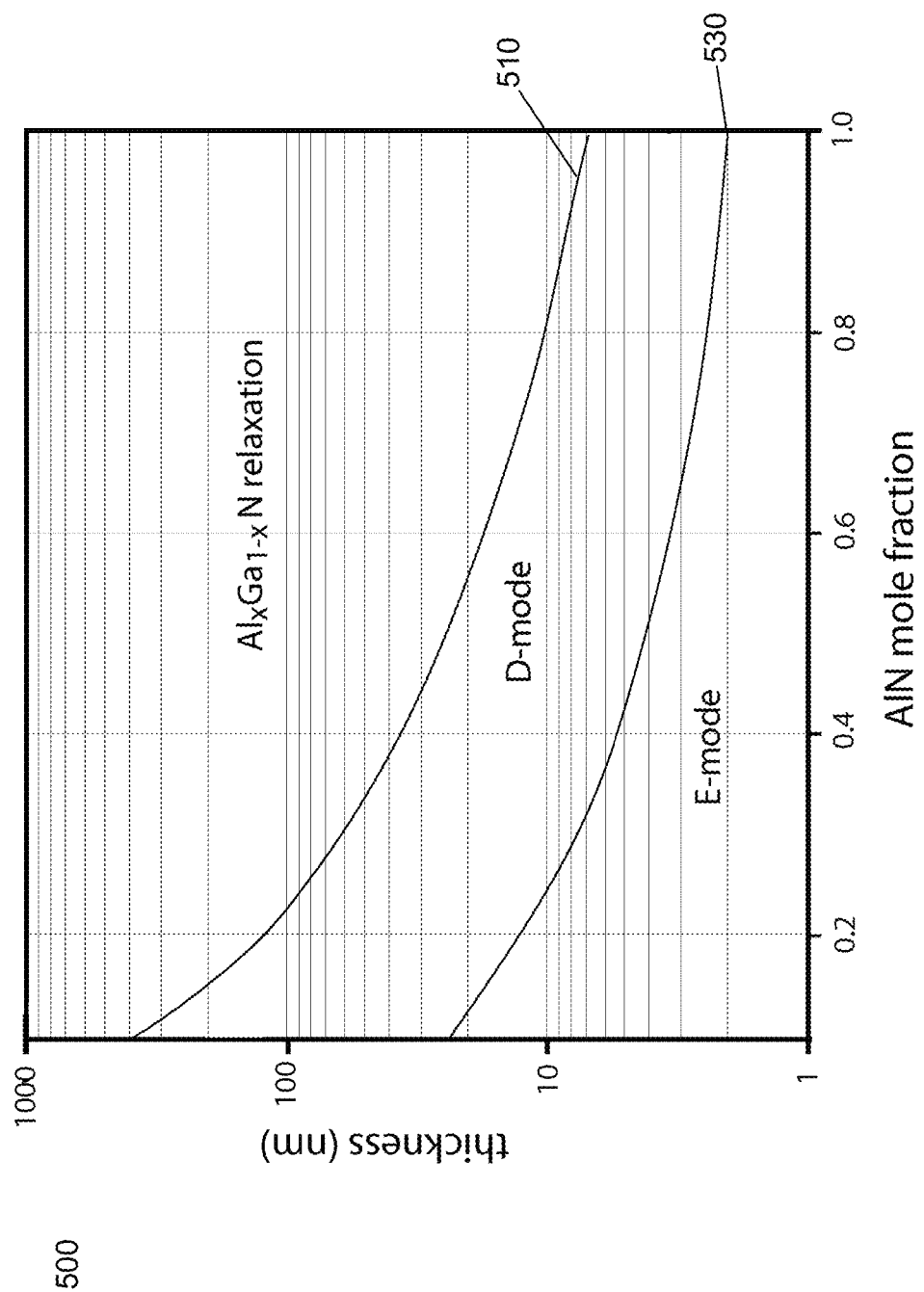
Figure 8:
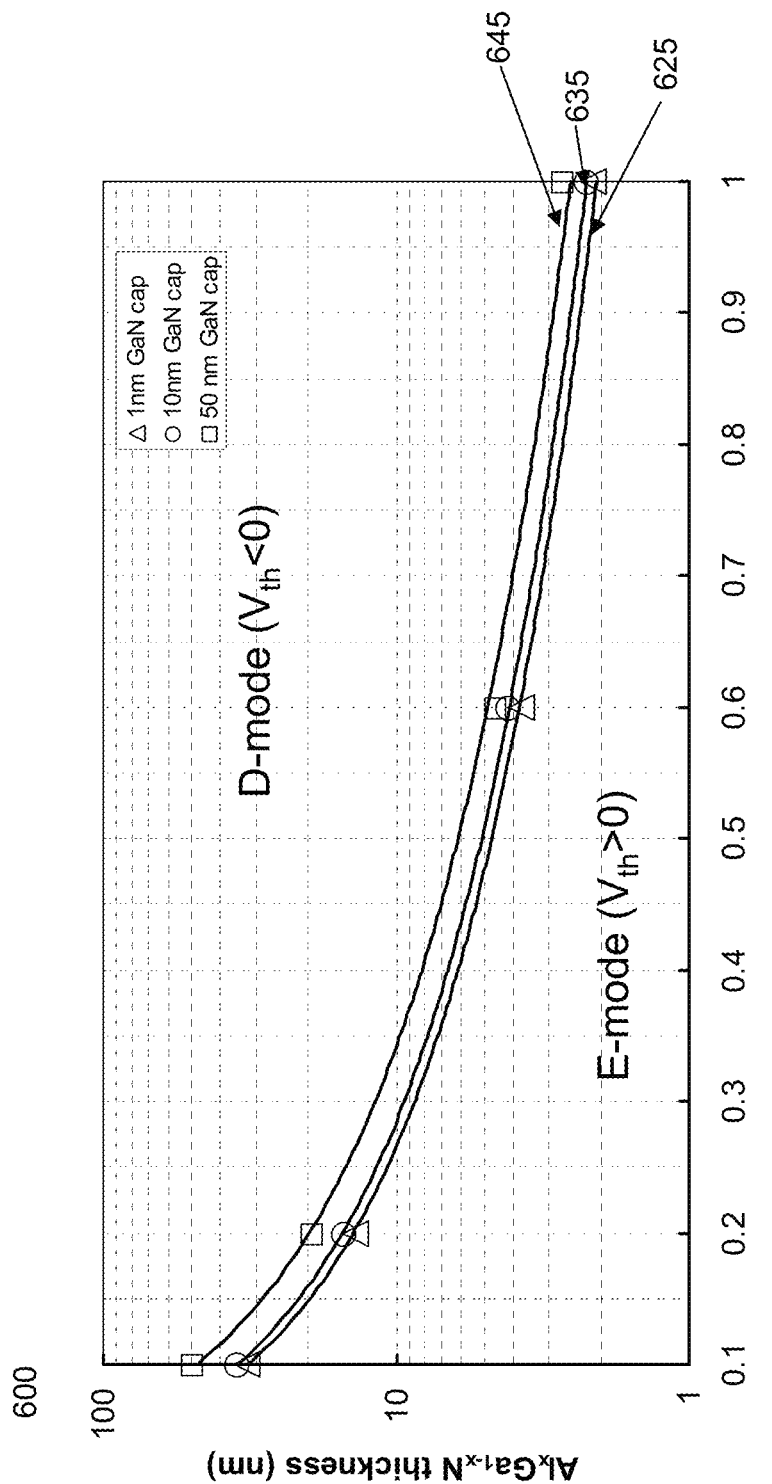

FIG. 6 shows how the zero threshold value of a device varies with the thickness and composition of the Barrier layer for various Cap layer thicknesses. FIG. 8 defines the embodiments of the present invention in that from FIG. 8 one can determine the layer thicknesses and composition of the Barrier layer. For example, an E-mode device is one with dimensions below the curve 625 where the Cap layer thickness is 1 nm. The Barrier layer thickness may be 1.3 nm (five monolayers) with a mole fraction (X) of 0.2. In this example the threshold voltage is greater than 0. The D-mode device may be constructed with dimensions and composition defined by the region above curve 645 given a 50 nm Cap layer. For a 50 nm Cap layer, the Barrier layer may be 20 nm thick (77 monolayers) with a mole fraction Y of 0.8. Likewise curve 635 shows the demarcation between E-mode and D-mode devices when the Cap layer is 10 nm thick.

The Barrier layer regrowth process and bandgap engineering processes described here allows E- and D-mode GaN device integration on a single die without the requirement of an etch step or fluorine treatment. The disadvantages of etching or treating with fluorine, such as degraded device reliability and limits on the processing control, are avoided by selective decomposition and regrowth. Once the individual devices are formed on a die, the dies may be cut from the wafer.

This invention makes use of bandgap engineering based on the unique piezoelectric properties of <0001>-oriented III-nitride materials, and involves selective surface cleaning and re-growth processes. Embodiments using the techniques herein may be used for the fill range of Barrier layer and Cap layer thicknesses relevant to AlGaN/GaN HEMTs. For a given composition of Barrier layer $Al_xGa_{1-x}N$ (0≤x≤1), reduction in 2DEG density provides a practical lower Barrier layer thickness limit of approximately 2 nm, while tensile strain relaxation via cracking provides a practical upper Barrier layer thickness limit of 400 nm.

Although practiced with GaN materials, this is not to imply a limitation. The techniques and methods above may be practiced with other combination of a Group III material and Group V materials. Typical Group III materials include Gallium and Indium. Group V materials include Nitrogen, Phosphorus, Arsenic, and Antimony. Channel layer materials include, by way of example and not limitation, GaN, InGaN and AlInGaN. Alternative Cap layer materials include, by way of example and not limitation, AlN, AlInN, AlGaN, and AlInGaN.

The Channel, Barrier and Cap layers have been described as single homogeneous layers, by example only, and not to imply a limitation. The various layers described may comprise multiple layers of the materials described above.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

We claim:

1. A method of converting an enhancement mode region to a depletion mode region comprising:
   receiving a die substantially comprising the enhancement mode region wherein the enhancement mode region comprises a Channel layer, a Barrier layer and a Cap layer;
   masking a region to be preserved as the enhancement mode region;
   decomposing the Cap layer to expose the Barrier layer;
   regrowing the Barrier Layer and the Cap layer such that the depletion mode region is created;
   removing the mask.

2. The method of claim 1 wherein the Channel layer and Cap layer comprise GaN.

3. The method of claim 2 wherein the Barrier layer comprises $Al_xGa_{1-x}N$, 0<X≤1.

4. The method of claim 1 wherein the mask material comprises SiO2, SiN, or Al2O3.

5. The method of claim 1 wherein the Cap layer is regrown by Molecular Beam Epitaxy.

6. The method of claim 1 wherein the Barrier layer is regrown by Molecular Beam Epitaxy.

* * * * *